United States Patent
Von Hofen et al.

(10) Patent No.: US 12,298,353 B2
(45) Date of Patent: May 13, 2025

(54) METHOD AND SYSTEM FOR DETERMINING AT LEAST ONE POWER CONTACT RESISTANCE

(71) Applicant: Andreas Stihl AG & Co. KG, Waiblingen (DE)

(72) Inventors: Malte Von Hofen, Stuttgart (DE); Christian Saemann, Stuttgart (DE)

(73) Assignee: Andreas Stihl AG & Co. KG, Waiblingen (DE)

( * ) Notice: Subject to any disclaimer, the term of this patent is extended or adjusted under 35 U.S.C. 154(b) by 322 days.

(21) Appl. No.: 17/851,144

(22) Filed: Jun. 28, 2022

(65) Prior Publication Data

US 2022/0413056 A1 Dec. 29, 2022

(30) Foreign Application Priority Data

Jun. 29, 2021 (EP) .................................... 21182439

(51) Int. Cl.
*G01R 31/389* (2019.01)
*G01R 31/385* (2019.01)
*G01R 31/396* (2019.01)

(52) U.S. Cl.
CPC ......... *G01R 31/389* (2019.01); *G01R 31/386* (2019.01); *G01R 31/396* (2019.01)

(58) Field of Classification Search
CPC .. H02J 7/00036; H02J 7/00047; G01R 27/14; G01R 31/386; G01R 31/396; G01R 31/389; H01M 10/425; H01M 2010/4271

(Continued)

(56) References Cited

U.S. PATENT DOCUMENTS

| 9,276,421 B2* | 3/2016 | Weissinger, Jr. ...... H01M 50/50 |
| 9,368,993 B2* | 6/2016 | Wijeratne ............... H02J 7/007 |

(Continued)

FOREIGN PATENT DOCUMENTS

| CN | 111141957 A | 5/2020 |
| DE | 10 2014 006 654 A1 | 11/2015 |
| DE | 20 2017 104 284 U1 | 12/2018 |

OTHER PUBLICATIONS

German-language Search Report issued in European Application No. 21182439.6 dated Jan. 18, 2022 with partial English translation (six (6) pages).

*Primary Examiner* — John H Le
(74) *Attorney, Agent, or Firm* — Crowell & Moring LLP

(57) ABSTRACT

A method determines at least one power contact resistance or at least one resistance value corresponding to the at least one power contact resistance between at least one pack power contact of a battery pack and at least one apparatus power contact of an electrically driven work apparatus or of a charging apparatus. The pack power contact and the apparatus power contact touch one another and are loaded with a power current. The battery pack and the work apparatus or the charging apparatus are electrically connected by a data communication line for transmitting a data communication signal. The method determines the power contact resistance or the resistance value by comparing a signal voltage variable of the data communication line and a power voltage variable of the at least one pack power contact or of the apparatus power contact with one another, wherein the signal voltage variable or the power voltage variable is dependent on a voltage drop caused by the power current and the at least one power contact resistance.

15 Claims, 5 Drawing Sheets

(58) Field of Classification Search
USPC .......................................................... 702/63
See application file for complete search history.

(56) References Cited

U.S. PATENT DOCUMENTS

| | | |
|---|---|---|
| 10,516,275 B2 | 12/2019 | Klee et al. |
| 2005/0194933 A1 | 9/2005 | Arnold et al. |
| 2014/0013012 A1* | 1/2014 | Terlizzi .................. G06F 13/38 710/15 |
| 2020/0203871 A1 | 6/2020 | Herrmann et al. |

* cited by examiner

METHOD AND SYSTEM FOR DETERMINING AT LEAST ONE POWER CONTACT RESISTANCE

CROSS REFERENCE TO RELATED APPLICATION

This application claims priority under 35 U.S.C. § 119 from European Patent Application No. 21182439.6, filed Jun. 29, 2021, the entire disclosure of which is herein expressly incorporated by reference.

BACKGROUND AND SUMMARY

The invention relates to a method and a system for determining at least one power contact resistance between at least one pack power contact of a battery pack and at least one apparatus power contact of an electrically driven work apparatus or of a charging apparatus or at least one resistance value corresponding to the at least one power contact resistance.

The invention addresses the problem of providing a method and a system in each case for determining at least one power contact resistance between at least one pack power contact of a battery pack and at least one apparatus power contact of an electrically driven work apparatus or of a charging apparatus or at least one resistance value corresponding to the at least one power contact resistance, said method and said system in each case comprising or having improved properties.

The, in particular automatic, method according to the invention is designed or configured or provided for, in particular automatically and/or indirectly, determining, in particular measuring, at least one, in particular electrical, power contact resistance, in particular at least one value of at least the power contact resistance, between at least one, in particular electrical, pack power contact of a battery pack and at least one, in particular electrical, apparatus power contact of an electrically driven work apparatus or of a, in particular electrical, charging apparatus or at least one resistance value corresponding to the at least one power contact resistance. The at least one pack power contact and the at least one apparatus power contact touch or make contact with one another, in particular mechanically and/or electrically and/or directly, and are loaded with a, in particular electrical, power current or operating current. The battery pack and the work apparatus or the charging apparatus are electrically, in particular galvanically, connected by means of a data communication line for transmitting or communicating a, in particular electrical, data communication signal. The method comprises or has, in particular the step of: determining, in particular automatically and/or indirectly determining and/or measuring, the at least one power contact resistance or the at least one resistance value by means of comparing a, in particular electrical, signal voltage variable, in particular a value of the signal voltage variable, of the data communication line and of a, in particular electrical, power voltage variable, in particular a value of the power voltage variable, of the at least one pack power contact or of the at least one apparatus power contact with one another. In particular either the signal voltage variable or the power voltage variable, in particular itself, is dependent on at least one, in particular electrical, voltage drop, in particular at least one value of at least the voltage drop, caused by the power current, in particular a value of the power current, and the at least one power contact resistance.

This enables the at least one power contact resistance or the at least one resistance value to be determined indirectly and/or, in particular consequently, simply and/or cost-effectively, in particular using existing means.

In particular, the data communication line and/or, in particular consequently, the signal voltage variable may be, in particular already, present.

Additionally or alternatively, the at least one power contact resistance and/or the at least one resistance value need or may not be determined by means of a, in particular separate, four-point measurement, in particular by means of additional measurement contacts.

Further additionally or alternatively, the data communication signal need or may not comprise information for and/or about determining the at least one power contact resistance or the at least one resistance value. Further additionally or alternatively, in particular instead, the signal voltage variable may be dependent on the at least one voltage drop.

The data communication signal may be transmitted by means of the signal voltage variable.

The power current may be transmitted by means of the at least one pack power contact and the at least one apparatus power contact.

The power current may be different from zero and/or be for charging and/or for discharging the battery pack, in particular for driving the work apparatus, in particular a drive motor of the work apparatus.

The method, in particular the comparing, may comprise, determining, in particular measuring, the signal voltage variable and/or the power voltage variable.

The signal voltage variable and the power voltage variable may be different.

The contact(s) may be referred to as terminal(s) or connection(s).

The touching of the at least one pack power contact and the at least one apparatus power contact may be, in particular toollessly and/or non-destructively, releasable. In other words: the battery pack may be designed for, in particular toollessly and/or non-destructively, releasable, in particular electrical and/or mechanical, connection to the work apparatus and/or the charging apparatus. In particular, the battery pack may be designed to be carried by the work apparatus and/or the charging apparatus. In particular, the work apparatus and/or the charging apparatus, in particular in each case, may comprise a battery receptacle, in particular a battery slot, wherein the battery receptacle may be designed for receiving the battery pack.

The work apparatus may be a garden, forestry, construction and/or groundwork apparatus, in particular a saw, in particular a chainsaw, a pole-mounted pruner, a brush cutter, a hedge trimmer, a hedge cutter, a blower, a leaf blower, a lopper, an angle grinder, a sweeper, a sweeping roller, a sweeping brush, a lawnmower, a scarifier, a grass trimmer or a high-pressure cleaner. Additionally or alternatively, the work apparatus may be ground- and/or hand-guided, in particular handheld. In particular hand-guided, in particular handheld, work apparatus may mean that the work apparatus may have a mass of a maximum of 50 kg (kilograms), in particular a maximum of 20 kg, in particular a maximum of 10 kg.

The battery pack may comprise a plurality of battery cells. In particular, the battery cells may each be individual rechargeable storage elements for electrical energy on an electrochemical basis. Additionally or alternatively, the battery cells may be lithium-ion battery cells. Further additionally or alternatively, the battery cells may be identical, in particular type-identical and/or structurally identical. Further additionally or alternatively, a, in particular respective, cell voltage, in particular rated cell voltage, of one, in particular respective one, of the battery cells may be a minimum of 2 V (volts) and/or a maximum of 4 V, in particular 3.6 V. Further additionally or alternatively, the battery cells may be round cells, prismatic cells or pouch cells.

In one development of the invention, the method, in particular the comparing, comprises: determining the at least one power contact resistance or the at least one resistance value by means of determining, in particular automatically and/or directly determining and/or measuring, the power current.

In one development of the invention, the data communication line is different or separate, in particular electrically insulated, from the at least one pack power contact and the at least one apparatus power contact. In particular, the battery pack comprises or has a, in particular electrical, pack data contact, which is different or separate, in particular electrically insulated, from the at least one pack power contact. The work apparatus or the charging apparatus comprises or has a, in particular electrical, apparatus data contact, which is different or separate, in particular electrically insulated, from the at least one apparatus power contact. The pack data contact and the apparatus data contact touch or make contact with one another, in particular mechanically and/or electrically and/or directly. The data communication line is at least partly, in particular completely, produced or formed by the touching of the pack data contact and the apparatus data contact. This makes it possible that, in particular either, the signal voltage variable or the power voltage variable may be dependent on the at least one voltage drop. In particular, a current and consequently a voltage drop across the data communication line caused by the current and a contact resistance between the pack data contact and the apparatus data contact may be negligible, in particular low, by comparison with the power current and the at least one power contact resistance.

In one development of the invention, the method comprises: comparing by means of ascertaining, in particular automatically ascertaining and/or determining and/or measuring and/or calculating, a deviation, in particular a value of the deviation and/or a difference, of the signal voltage variable and the power voltage variable from one another.

In one development of the invention, the power voltage variable is a power voltage potential, in particular a negative power voltage potential and/or a positive power voltage potential, of the pack power contact, in particular of a negative pack power contact and/or of a positive pack power contact, and/or a power voltage difference between the positive power voltage potential of the positive pack power contact and the negative power voltage potential of the negative pack power contact. Alternatively, the power voltage variable is a power voltage potential, in particular a negative power voltage potential and/or a positive power voltage potential, of the apparatus power contact, in particular of a negative apparatus power contact and/or of a positive apparatus power contact, and/or a power voltage difference between the positive power voltage potential of the positive apparatus power contact and the negative power voltage potential of the negative apparatus power contact. Such a power voltage variable is particularly suitable, in particular advantageous, for the comparing.

In one development of the invention, the signal voltage variable is a signal voltage level or potential, in particular a low signal voltage level or a high signal voltage level, of the data communication line and/or a signal voltage difference or amplitude or a signal voltage swing between the high signal voltage level and the low signal voltage level. Such a signal voltage variable is particularly suitable, in particular advantageous, for the comparing. In particular, the data communication signal may be binary. For the rest, reference is made to the technical literature.

In one configuration of the invention, the method comprises: determining a, in particular first, power contact resistance between a, in particular first, pack power contact of the battery pack and a, in particular first, apparatus power contact of the work apparatus or of the charging apparatus or a, in particular first, resistance value corresponding to the power contact resistance by means of comparing the signal voltage level and the power voltage potential with one another. In particular either, the signal voltage level or the power voltage potential is dependent on a, in particular first, voltage drop caused by the power current and the power contact resistance. Additionally or alternatively, in particular temporally afterwards, determining a, in particular second and/or other, power contact resistance between a, in particular second and/or other, pack power contact of the battery pack and a, in particular second and/or other, apparatus power contact of the work apparatus or of the charging apparatus or a, in particular second and/or other, assistance value corresponding to the power contact resistance by means of comparing the signal voltage difference and the power voltage difference with one another. In particular either, the signal voltage difference or the power voltage difference is dependent on at least one, in particular second and/or other, voltage drop caused by the power current and the at least one power contact resistance. This makes it possible to determine a positive power contact resistance or a corresponding positive resistance value and/or a negative power contact resistance or a corresponding negative resistance value, in particular in each case, or these different power contact resistances or resistance values.

In one development of the invention, in particular either, the signal voltage variable is referenced to a power voltage potential, in particular a negative power voltage potential and/or a positive power voltage potential, of the apparatus power contact, in particular of a negative apparatus power contact and/or of a positive apparatus power contact, and/or is dependent on a power voltage difference between the positive power voltage potential of the positive apparatus power contact and the negative power potential of the negative apparatus power contact. Alternatively or additionally, the signal voltage variable is referenced to a power voltage potential, in particular a negative power voltage potential and/or a positive power voltage potential, of the pack power contact, in particular of a negative pack power contact and/or of a positive pack power contact, and/or is dependent on a power voltage difference between the positive power voltage potential of the positive pack power contact and the negative power voltage potential of the negative pack power contact. This makes it possible that, in particular either, the signal voltage variable or the power voltage variable may be dependent on the at least one voltage drop.

In one development of the invention, the data communication line is electrically, in particular galvanically, connected to a signal output of a, in particular electrical, transmitter, in particular of an amplifier circuit, in particular of the work apparatus or of the charging apparatus or of the battery pack. At least one, in particular electrical, supply voltage potential of the transmitter is dependent on at least one, in particular the at least one, voltage drop caused by the power current and the at least one power contact resistance. In particular, the transmitter has or comprises a power supply rejection ratio. Additionally or alternatively, at least one, in particular electrical, supply voltage potential of the transmitter is referenced to at least one power voltage potential of the at least one apparatus power contact or at least one power voltage potential of the at least one pack power contact, in particular is the at least one power voltage potential. Further additionally or alternatively, at least one supply voltage input of the transmitter is electrically, in particular galvanically, connected to, in particular connected in parallel with, the at least one apparatus power contact or the at least one pack power contact. This makes it possible that the signal voltage variable may be dependent on the at least one voltage drop or may be such as mentioned above. In particular, the data communication line may be electrically, in particular galvanically, connected to a signal input of a, in particular electrical, receiver, in particular of the battery pack or of the work apparatus or of the charging apparatus. Additionally or alternatively, the data communication signal may be amplified by means of the amplifier circuit. Further additionally or alternatively, the amplifier circuit may comprise, in particular be, an operational and/or differential amplifier circuit. For the rest, reference is made to the technical literature.

In one development of the invention, the data communication signal comprises or has operating data information, rotational speed information, current information, voltage information, power information, discharge information, charging information, temperature information, state information, fault information and/or identifier information. Such information/items of information is/are suitable, in particular advantageous, for operation and/or evaluation of the operation of the battery pack, of the work apparatus and/or of the charging apparatus. In particular, the rotational speed information may be about a rotational speed and/or the current information may be about a motor current of a drive motor of the work apparatus. Additionally or alternatively, the temperature information may be about a temperature of a drive motor of the work apparatus and/or of battery cells of the battery pack. Further additionally or alternatively, the state information may be about a state, the fault information may be about a fault and/or the identifier information may be about an identifier of the work apparatus and/or of the battery pack. Further additionally or alternatively, the, in particular respective, information may be different from the signal voltage variable, in particular of a type different from that of the signal voltage variable. For the rest, reference is made to the technical literature.

In one development of the invention, the at least one pack power contact and/or the at least one apparatus power contact are/is, in particular in each case, a plug connector. In particular, the plug connector may be a plug or a, in particular corresponding, socket. This makes it possible that the power contact resistance may be non-negligible, in particular high, and/or makes possible the releasability as mentioned above.

In one development of the invention, a, in particular electrical, rated voltage of the battery pack, of the work apparatus and/or of the charging apparatus is a minimum of 18 V, in particular a minimum of 30 V, and/or a maximum of 72 V, in particular a maximum of 54 V. Additionally or alternatively, a maximum, in particular electrical, power current, in particular charging and/or discharging power current, in particular drive power current, of the battery pack, of the work apparatus and/or of the charging apparatus is a minimum of 1 A (ampere), in particular a minimum of 1.5 A, and/or a maximum of 1000 A, in particular a maximum of 750 A. Further additionally or alternatively, a maximum, in particular electrical, power of the battery pack, of the work apparatus and/or of the charging apparatus is a minimum of 1 kW (kilowatt), in particular a minimum of 2 kW, and/or a maximum of 10 kW, in particular a maximum of 5 kW. Further additionally or alternatively, a maximum, in particular electrical, energy content, in particular rated energy content, of the battery pack is a minimum of 100 Wh (watt-hours), in particular a minimum of 200 Wh, and/or a maximum of 4000 Wh, in particular a maximum of 2000 Wh. This makes it possible that the power contact resistance may be non-negligible, in particular high.

In one development of the invention, the method comprises or has, in particular the step of: outputting, in particular automatically outputting, and/or transmitting, in particular automatically transmitting, information, in particular user-perceptible information, about the at least one power contact resistance determined or the at least one resistance value determined, in particular if the at least one power contact resistance determined or the at least one resistance value determined reaches or exceeds a, in particular predefined, resistance limit value. Additionally or alternatively, if the at least one power contact resistance determined or the at least one resistance value determined reaches or exceeds a, in particular predefined, resistance limit value, decreasing, in particular automatically decreasing, a maximum released power and/or a maximum released power current, in particular switching off the battery pack, the work apparatus and/or the charging apparatus. This makes possible protection, cleaning, maintenance and/or repair of the battery pack, of the work apparatus and/or of the charging apparatus. In particular, the information may comprise, in particular be, protection information, cleaning information, maintenance information, repair information and/or decreasing, in particular switching off, information. Additionally or alternatively, the outputting may be optical, acoustic and/or haptic. Further additionally or alternatively, the transmitting may be cordless or wireless and/or comprise, in particular be, sending.

The, in particular electrical, system according to the invention is designed or configured for determining at least one, in particular the at least one, power contact resistance between at least one, in particular the at least one, pack power contact of a, in particular the, battery pack and at least one, in particular the at least one, apparatus power contact of a, in particular the, electrically driven work apparatus or of a, in particular the, charging apparatus or at least one, in particular the at least one, resistance value corresponding to the at least one power contact resistance. The at least one pack power contact and the at least one apparatus power contact touch one another and are loaded with a, in particular the, power current. The battery pack and the work apparatus or the charging apparatus are electrically connected by means of a, in particular the, data communication line for transmitting a, in particular the, data communication signal. The system is designed or configured for determining the at least one power contact resistance or the at least one resistance value by means of comparing a, in particular the, signal voltage variable of the data communication line and a, in particular the, power voltage variable of the at least one pack power contact or of the at least one apparatus power contact with one another. The signal voltage variable or the power voltage variable is dependent on at least one, in particular the at least one, voltage drop caused by the power current and the at least one power contact resistance.

The system may make possible the same advantage(s) as mentioned above for the method.

In particular, the system, in particular a battery management system of the system, may be designed or configured for, in particular automatically, carrying out a, in particular the, method as mentioned above.

In one development of the invention, the system comprises or has the battery pack, the work apparatus and/or the charging apparatus. In particular, the battery pack, the work apparatus and/or the charging apparatus may have or comprise, in particular in each case, a, in particular the, battery management system.

Further advantages and aspects of the invention are evident from the claims and from the description of exemplary embodiments of the invention which are explained below with reference to the figures.

DETAILED DESCRIPTION OF THE DRAWINGS

Figure 1:
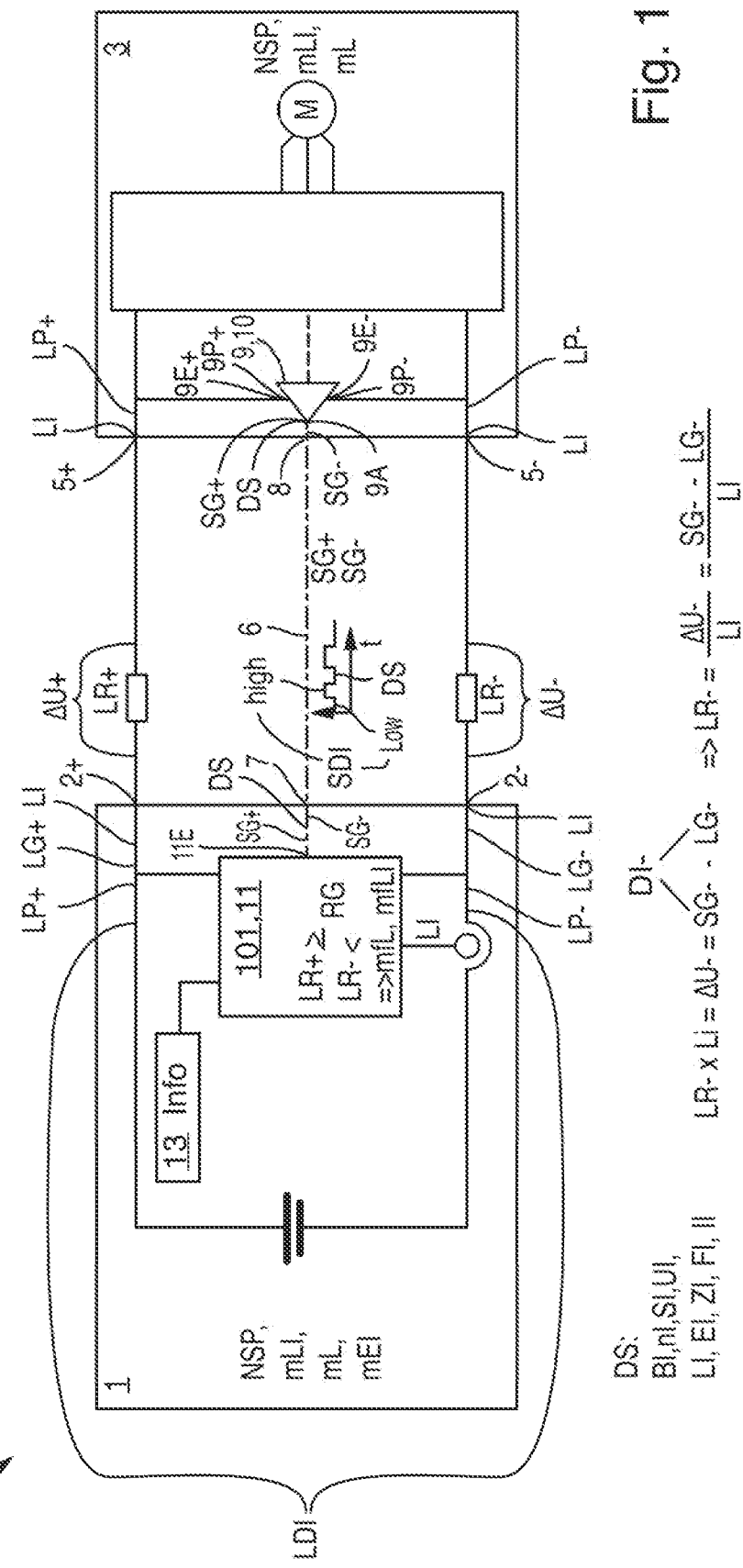
FIGS. 1 to 4 are schematic views, in particular circuit diagrams, in each case of a system according to an embodiment of the invention and of a method according to an embodiment of the invention.

FIGS. 1 to 4 and 5 show, in particular in each case, a system 100 and a method for determining at least one power contact resistance LR+, LR− between at least one pack power contact 2+, 2− of a battery pack 1 and at least one apparatus power contact 5+, 5− of an electrically driven work apparatus 3 or of a charging apparatus 4 or at least one resistance value corresponding to the at least one power contact resistance. The at least one pack power contact 2+, 2− and the at least one apparatus power contact 5+, 5− touch one another and are loaded with a power current LI. The battery pack 1 and the work apparatus 3 or the charging apparatus 4 are electrically connected, in particular transmitted, by means of, in particular only, a, in particular single, data communication line 6 for transmitting a data communication signal DS.

The system 100, in particular a battery management system 101 of the system 100, is configured for determining the at least one power contact resistance LR+, LR− of the at least one resistance value by means of comparing a signal voltage variable SG+, SG− of the data communication line 6 and a power voltage variable LG+, LG− of the at least one pack power contact 2+, 2− or of the at least one apparatus power contact 5+, 5− with one another, in particular the system compares and determines.

The method comprises: determining the at least one power contact resistance LR+, LR− or the at least one resistance value by means of comparing the signal voltage variable SG+, SG− of the data communication line 6 and the power voltage variable LG+, LG− of the at least one pack power contact 2+, 2− or of the at least one apparatus power contact 5+, 5− with one another, in particular by means of the system 100, in particular the battery management system 101.

The signal voltage variable SG+, SG− or the power voltage variable LG+, LG− is dependent on at least one voltage drop ΔU+, ΔU− caused by the power current LI and the at least one power contact resistance LR+, LR−.

In detail the method comprises: determining the at least one power contact resistance LR+, LR− or the at least one resistance value by means of determining the power current LI, in particular by means of the system 100, in particular the battery management system 101.

Furthermore, in the exemplary embodiments shown, the method comprises: determining the signal voltage variable SG+, SG− and/or the power voltage variable LG+, LG−, in particular by means of the system 100, in particular the battery management system 101.

Moreover, the system 100 comprises the battery pack 1, the work apparatus 3 and/or the charging apparatus 4.

In FIG. 1 the battery pack 1 comprises the battery management system 101.

Furthermore, a negative power contact resistance LR− between a negative pack power contact 2− of the battery pack 1 and a negative apparatus power contact 5− of the work apparatus 3 is determined by means of comparing a negative signal voltage variable SG− of the data communication line 6 and a negative power voltage variable LG− of the negative pack power contact 2−, in particular by means of the system 100, in particular the battery management system 101. The negative pack power contact 2− and the negative apparatus power contact 5− touch one another and are loaded with the power current LI. The negative signal voltage variable SG− is dependent on a negative voltage drop ΔU− caused by the power current LI and the negative power contact resistance LR−.

In addition, a positive power contact resistance LR+ between a positive pack power contact 2+ of the battery pack 1 and a positive apparatus power contact 5+ of the work apparatus 3 is determined by means of comparing a positive signal voltage variable SG+ of the data communication line 6 and a positive power voltage variable LG+ of the positive pack power contact 2+, in particular by means of the system 100, in particular the battery management system 101. The positive pack power contact 2+ and the positive apparatus power contact 5+ touch one another and are loaded with the power current LI. The positive signal voltage variable SG+ is dependent on the negative voltage drop ΔU− caused by the power current LI and the negative power contact resistance LR− and a positive voltage drop ΔU+ caused by the power current LI and the positive power contact resistance LR+.

Figure 2:
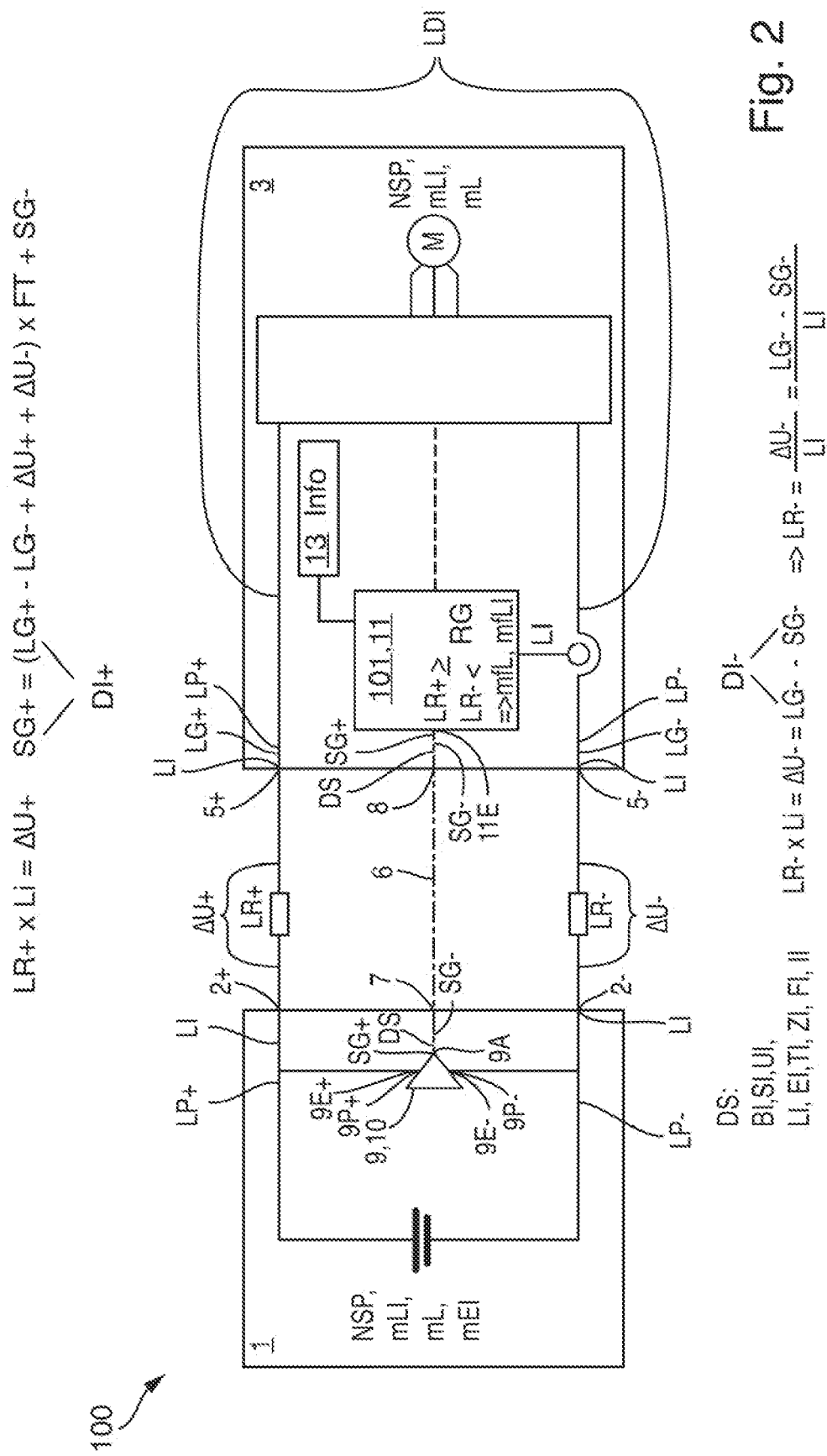

In FIG. 2 the work apparatus 3 comprises the battery management system 101.

Furthermore, the negative power contact resistance LR− between the negative pack power contact 2− of the battery pack 1 and the negative apparatus power contact 5− of the work apparatus 3 is determined by means of comparing a negative signal voltage variable SG− of the data communication line 6 and a negative power voltage variable LG− of the negative apparatus power contact 5−, in particular by means of the system 100, in particular the battery management system 101. The negative pack power contact 2− and the negative apparatus power contact 5− touch one another and are loaded with the power current LI. The negative power voltage variable LG− is dependent on the negative voltage drop ΔU− caused by the power current LI and the negative power contact resistance LR−.

In addition, the positive power contact resistance LR+ between the positive pack power contact 2+ of the battery pack 1 and the positive apparatus power contact 5+ of the work apparatus 3 is determined by means of comparing a positive signal voltage variable SG+ of the data communication line 6 and a positive power voltage variable LG+ of the positive apparatus power contact 5+, in particular by means of the system 100, in particular the battery management system 101. The positive pack power contact 2+ and the positive apparatus power contact 5+ touch one another and are loaded with the power current LI. The positive power voltage variable LG+ is dependent on the negative voltage drop ΔU− caused by the power current LI and the negative power contact resistance LR− and the positive voltage drop ΔU+ caused by the power current LI and the positive power contact resistance LR+.

Figure 3:
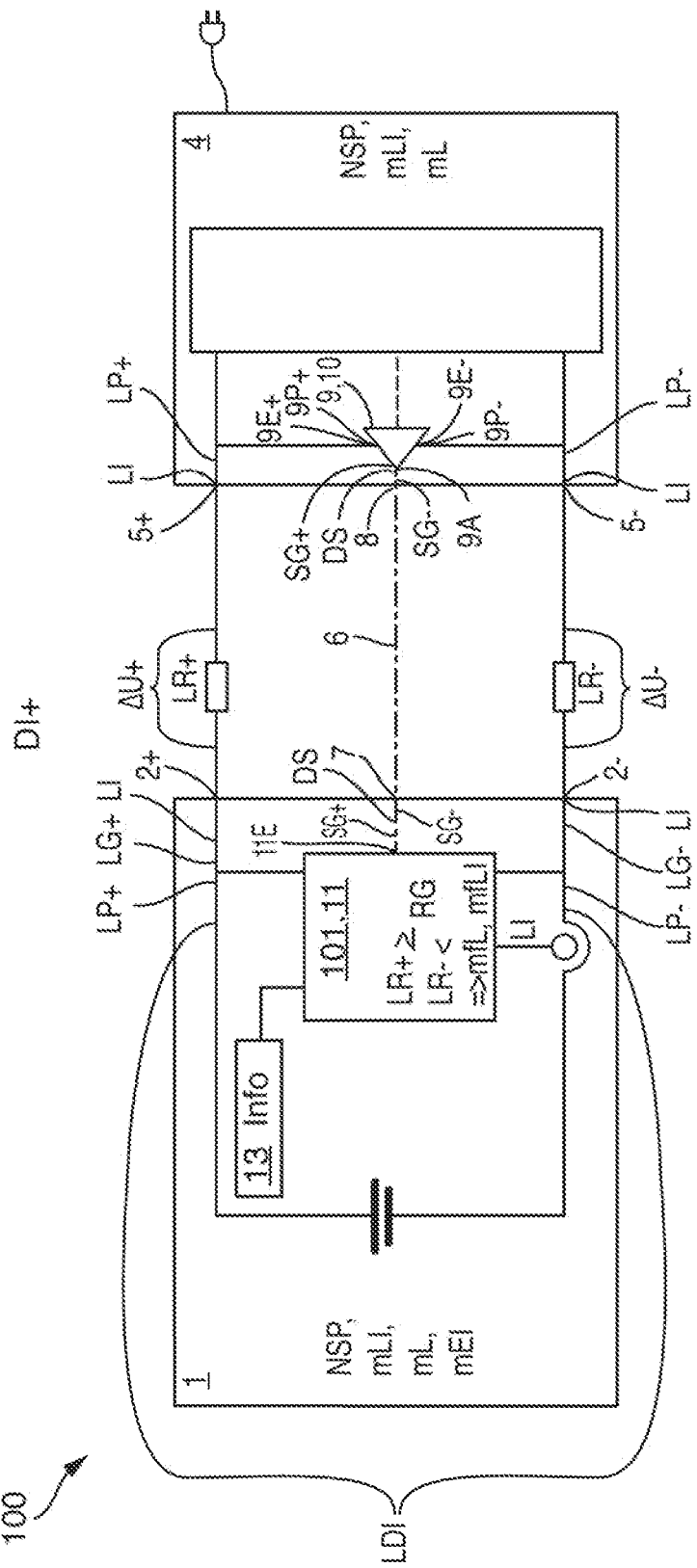

In FIG. 3 the battery pack 1 comprises the battery management system 101.

Furthermore, a negative power contact resistance LR− between the negative pack power contact 2− of the battery pack 1 and a negative apparatus power contact 5− of the charging apparatus 4 is determined by means of comparing a negative signal voltage variable SG− of the data communication line 6 and a negative power voltage variable LG− of the negative pack power contact 2−, in particular by means of the system 100, in particular the battery management system 101. The negative pack power contact 2− and the negative apparatus power contact 5− touch one another and are loaded with the power current LI. The negative power voltage variable LG− is dependent on a negative voltage drop ΔU− caused by the power current LI and the negative power contact resistance LR−.

In addition, a positive power contact resistance LR+ between the positive pack power contact 2+ of the battery pack 1 and a positive apparatus power contact 5− of the charging apparatus 4 is determined by means of comparing a positive signal voltage variable SG+ of the data communication line 6 and a positive power voltage variable LG+ of the positive pack power contact 2+, in particular by means of the system 100, in particular the battery management system 101. The positive pack power contact 2+ and the positive apparatus power contact 5+ touch one another and are loaded with the power current LI. The positive power voltage variable LG+ is dependent on the negative voltage drop ΔU− caused by the power current LI and the negative power contact resistance LR− and a positive voltage drop ΔU+ caused by the power current LI and the positive power contact resistance LR+.

Figure 4:
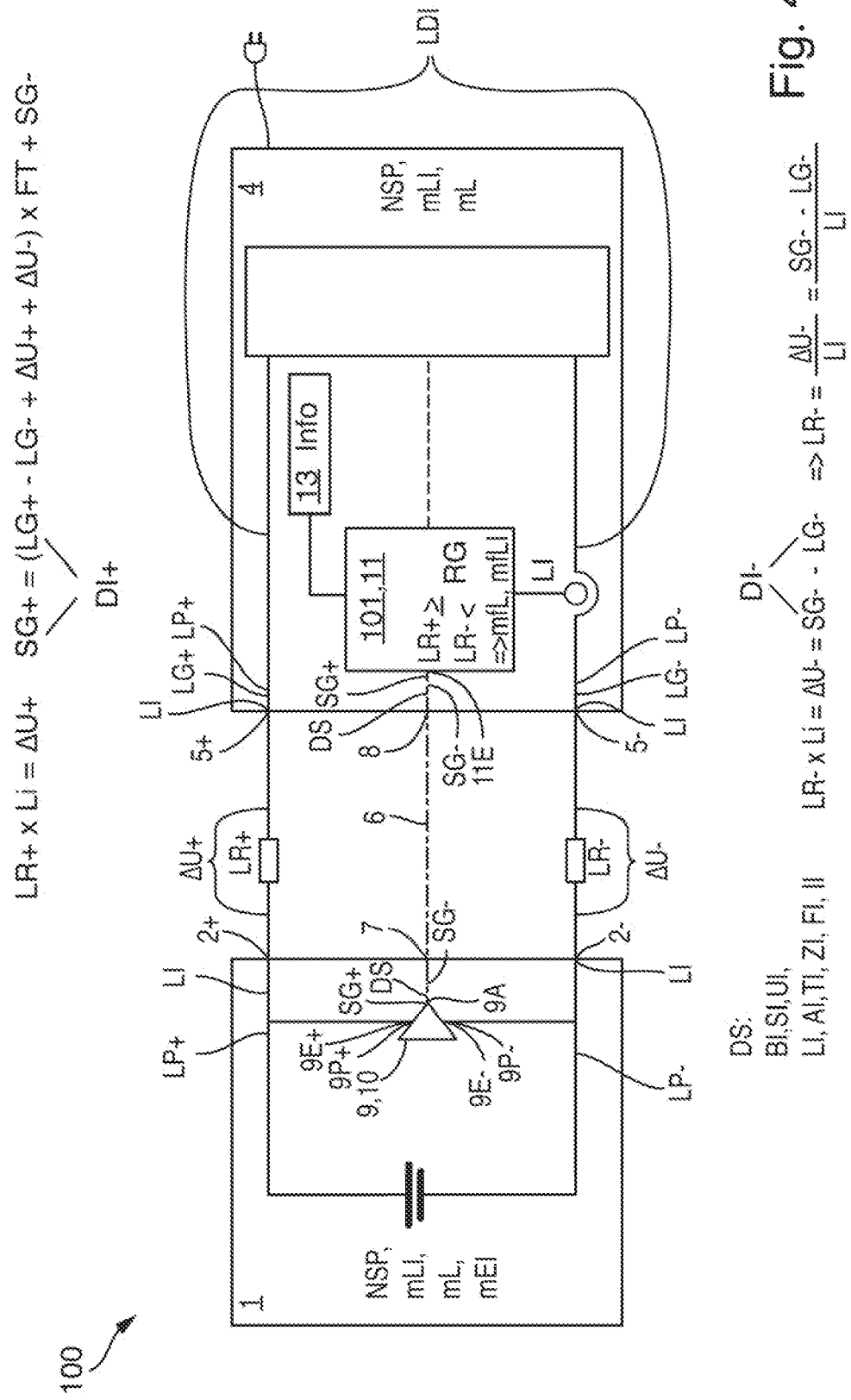

In FIG. 4 the charging apparatus 4 comprises the battery management system 101.

Furthermore, the negative power contact resistance LR− between the negative pack power contact 2− of the battery pack 1 and the negative apparatus power contact 5− of the charging apparatus 4 is determined by means of comparing a negative signal voltage variable SG− of the data communication line 6 and a negative power voltage variable LG− of the negative apparatus power contact 5−, in particular by means of the system 100, in particular the battery management system 101. The negative pack power contact 2− and the negative apparatus power contact 5− touch one another and are loaded with the power current LI. The negative signal voltage variable SG− is dependent on the negative voltage drop ΔU− caused by the power current LI and the negative power contact resistance LR−.

In addition the positive power contact resistance LR+ between the positive pack power contact 2+ of the battery pack 1 and the positive apparatus power contact 5+ of the charging apparatus 4 is determined by means of comparing a positive signal voltage variable SG+ of the data communication line 6 and a positive power voltage variable LG+ of the positive apparatus power contact 5+, in particular by means of the system 100, in particular the battery management system 101. The positive pack power contact 2+ and the positive apparatus power contact 5+ touch one another and are loaded with the power current LI. The positive signal voltage variable SG+ is dependent on the negative voltage drop ΔU− caused by the power current LI and the negative power contact resistance LR− and the positive voltage drop ΔU+ caused by the power current LI and the positive power contact resistance LR+.

In alternative exemplary embodiments, a sum of a, in particular the, negative power contact resistance and a, in particular the, positive power contact resistance may be determined. Additionally or alternatively, in alternative exemplary embodiments, a, in particular the, negative signal voltage variable and/or a, in particular the, positive signal voltage variable and/or a, in particular the, negative power voltage variable and/or a, in particular the, positive power voltage variable may be dependent on a, in particular the, negative voltage drop caused by the power current and the negative power contact resistance and/or a, in particular the, positive voltage drop caused by the power current and the positive power contact resistance.

Furthermore, in the exemplary embodiments shown, the data communication line 6 is different from the at least one pack power contact 2+, 2− and the at least one apparatus power contact 5+, 5−. In particular, the batter pack 1 comprises, in particular only, a, in particular single, pack data contact 7, which is different from the at least one pack power contact 2+, 2−. The work apparatus 3 or the charging apparatus 4 comprises, in particular only, a, in particular single, apparatus data contact 8, which is different from the at least one apparatus power contact 5+, 5−. The pack data contact 7 and the apparatus data contact 8 touch one another. The data communication line 6 is at least partly produced by the touching of the pack data contact 7 and the apparatus data contact 8.

In addition, the method comprises: comparing by means of ascertaining a deviation DI−, DI+, in particular a difference DI−, DI+, of the signal voltage variable SG+, SG− and the power voltage variable LG+, LG− from one another, in particular by means of the system 100, in particular the battery management system 101.

In FIGS. 1 and 3, the negative power voltage variable LG− is a negative power voltage potential LP− of the negative pack power contact 2−. The positive power voltage variable LG+ is a positive power voltage potential LP+ of the positive pack power contact 2+ and/or a power voltage difference LDI between the positive power voltage potential LP+ of the positive pack power contact 2+ and the negative power voltage potential LP− of the negative pack power contact 2−.

In FIGS. 2 and 4, the negative power voltage variable LG− is a negative power voltage potential LP− of the negative apparatus power contact 5−. The positive power voltage variable LG+ is a positive power voltage potential LP+ of the positive apparatus power contact 5+ and/or a power voltage difference LDI between the positive power voltage potential LP+ of the positive apparatus power contact 5+ and the negative power voltage potential LP− of the negative apparatus power contact 5−.

Furthermore, in the exemplary embodiments shown, the negative signal voltage variable SG− is a low signal voltage level low of the data communication line 6. The positive signal voltage variable SG+ is a high signal voltage level high of the data communication line 6 and/or a signal voltage difference SDI between the high signal voltage level high and the low signal voltage level low.

In FIGS. 1 and 2, the method comprises: determining the negative power contact resistance LR− between the negative pack power contact 2− of the battery pack 1 and the negative apparatus power contact 5− of the work apparatus 3 by means of comparing the negative signal voltage level low and the negative power voltage potential LP− with one another. In FIG. 1, the negative signal voltage level low is dependent on the negative voltage drop ΔU− caused by the power current LI and the negative power contact resistance LR−. In FIG. 2 the negative power voltage potential LP− is dependent on the negative voltage drop ΔU− caused by the power current LI and the negative power contact resistance LR−.

In addition, the method comprises: determining the positive power contact resistance LR+ between the positive pack power contact 2+ of the battery pack 1 and the positive apparatus power contact 5+ of the work apparatus 3 by means of comparing the signal voltage difference SDI and the power voltage difference LDI with one another. In FIG. 1 the signal voltage difference SDI is dependent on the negative voltage drop ΔU− caused by the power current LI and the negative power contact resistance LR− and the positive voltage drop ΔU+ caused by the power current LI and the positive power contact resistance LR+. In FIG. 2 the power voltage difference LDI is dependent on the negative voltage drop ΔU− caused by the power current LI and the negative power contact resistance LR− and the positive voltage drop ΔU+ caused by the power current LI and the positive power contact resistance LR+.

In FIGS. 3 and 4, the method comprises: determining the negative power contact resistance LR− between the negative pack power contact 2− of the battery pack 1 and the negative apparatus power contact 5− of the charging apparatus 4 by means of comparing the negative signal voltage level low and the negative power voltage potential LP− with one another. In FIG. 3 the negative power voltage potential LP− is dependent on the negative voltage drop ΔU− caused by the power current LI and the negative power contact resistance LR−. In FIG. 4 the negative signal voltage level low is dependent on the negative voltage drop ΔU− caused by the power current LI and the negative power contact resistance LR−.

Furthermore, the method comprises: determining the positive power contact resistance LR+ between the positive pack power contact 2+ of the battery pack 1 and the positive apparatus power contact 5+ of the charging apparatus 4 by means of comparing the signal voltage difference SDI and the power voltage difference LDI with one another. In FIG. 3 the power voltage difference LDI is dependent on the negative voltage drop ΔU− caused by the power current LI and the negative power contact resistance LR− and the positive voltage drop ΔU+ caused by the power current LI and the positive power contact resistance LR+. In FIG. 4 the signal voltage difference SDI is dependent on the negative voltage drop ΔU− caused by the power current LI and the negative power contact resistance LR− and the positive voltage drop ΔU+ caused by the power current LI and the positive power contact resistance LR+.

In FIGS. 1 and 3, the negative signal voltage variable SG− is referenced to the negative power voltage potential LP− of the negative apparatus power contact 5−. The positive signal voltage variable SG+ is referenced to the negative power voltage potential LP− of the negative apparatus power contact 5− and/or is dependent on the power voltage difference LDI between the positive power voltage potential LP+ of the positive apparatus power contact 5+ and the negative power voltage potential LP− of the negative apparatus power contact 5−.

In FIGS. 2 and 4, the negative signal voltage variable SG− is referenced to the negative power voltage potential LP− of the negative pack power contact 2−. The positive signal voltage variable SG+ is referenced to the negative power voltage potential LP− of the negative pack power contact 2− and/or is dependent on the power voltage difference LDI between the positive power voltage potential LP+ of the positive pack power contact 2+ and the negative power voltage potential LP− of the negative pack power contact 2−.

In alternative exemplary embodiments, the signal voltage variable can be referenced to the positive power voltage potential of the positive apparatus power contact or of the positive pack power contact.

In addition, in the exemplary embodiments shown, the data communication line 6 is electrically connected to a signal output 9A of a transmitter 9, in particular of an amplifier circuit 10, of the work apparatus 3 in FIG. 1, of the charging apparatus 4 in FIG. 3 and of the battery pack 2 in FIGS. 2 and 4.

In FIGS. 1 and 4, a negative supply voltage potential 9P− of the transmitter 9 is dependent on the negative voltage drop ΔU− caused by the power current LI and the negative power contact resistance LR−. A positive supply voltage potential 9P+ of the transmitter 9 is dependent on the negative voltage drop ΔU− caused by the power current LI and the negative power contact resistance LR− and the positive voltage drop ΔU+ caused by the power current LI and the positive power contact resistance LR+.

In particular, the transmitter 9 has a power supply rejection ratio.

Additionally or alternatively, in FIGS. 1 and 3, the negative supply voltage potential 9P− of the transmitter 9 is referenced to the negative power voltage potential LP− of the negative apparatus power contact 5−, in particular is the negative power voltage potential LP−. The positive supply voltage potential 9P+ of the transmitter 9 is referenced to the positive power voltage potential LP+ of the positive apparatus power contact 5+, in particular is the positive power voltage potential LP+.

In FIGS. 2 and 4, the negative supply voltage potential 9P− of the transmitter 9 is referenced to the negative power voltage potential LP− of the negative pack power contact 2−, in particular is the negative power voltage potential LP−. The positive supply voltage potential 9P+ of the transmitter 9 is referenced to the positive power voltage potential LP+ of the positive pack power contact 2+, in particular is the positive power voltage potential LP+.

Further additionally or alternatively, in FIGS. 1 and 3, a negative supply voltage input 9E− of the transmitter 9 is electrically connected to, in particular connected in parallel with, the negative apparatus power contact 5−. A positive supply voltage input 9E+ of the transmitter 9 is electrically connected to, in particular connected in parallel with, the positive apparatus power contact 5+.

In FIGS. 2 and 4, the negative supply voltage input 9E− of the transmitter 9 is electrically connected to, in particular connected in parallel with, the negative pack power contact 2−. The positive supply voltage input 9E+ of the transmitter 9 is electrically connected to, in particular connected in parallel with, the positive pack power contact 2+.

In addition, the data communication line 6 is electrically connected to a signal input 11E of a receiver 11, of the battery pack 2 in FIGS. 1 and 3, of the work apparatus 3 in FIG. 2 and of the charging apparatus 4 in FIG. 4, in particular of the battery management system 101.

Furthermore, the data communication signal DS comprises operating data information BI, rotational speed information nI, current information SI, voltage information UI, power information LI, discharge information EI, charging information AI, temperature information TI, state information ZI, fault information FI and/or identifier information II.

In addition, the at least one pack power contact 2+, 2− and/or the at least one apparatus power contact 5+, 5− are/is a plug connector 12.

Furthermore, a rated voltage NSP of the battery pack 1, of the work apparatus 3 and/or of the charging apparatus 4 is a minimum of 18 V, in particular a minimum of 30 V, and/or a maximum of 72 V, in particular a maximum of 54 V.

Additionally or alternatively, a maximum power current mLI of the battery pack 1, of the work apparatus 3 and/or of the charging apparatus 4 is a minimum of 1 A, in particular a minimum of 1.5 A, and/or a maximum of 1000 A, in particular a maximum of 750 A.

Further additionally or alternatively, a maximum power mL of the battery pack 1, of the work apparatus 3 and/or of the charging apparatus 4 is a minimum of 1 kW, in particular a minimum of 2 kW, and/or a maximum of 10 kW, in particular a maximum of 5 kW.

Further additionally or alternatively, a maximum energy content mEI of the battery pack 1 is a minimum of 100 Wh, in particular a minimum of 200 Wh, and/or a maximum of 4000 Wh, in particular a maximum of 2000 Wh.

In addition, the system 100, in FIGS. 1 and 3 the battery pack 1, in FIG. 2 the work apparatus 3 and in FIG. 4 the charging apparatus 4, comprises an, in particular electrical, output and/or transmission device 13.

In particular, the output and/or transmission device may comprise a display, a sound generator and/or a vibration device. Additionally or alternatively, the output and/or transmission device may comprise a, in particular electrical and/or wireless, sending device. In particular, the sending device may comprise, in particular be, a UMTS, WLAN and/or Bluetooth sending device or a sending device based on some other technology.

Furthermore, the method comprises: outputting and/or transmitting information Info about the at least one power contact resistance LR+, LR− determined or the at least one resistance value determined, in particular if the at least one power contact resistance LR+, LR− determined or the at least one resistance value determined reaches or exceeds a resistance limit value RG, in particular by means of the output and/or transmission device 13.

Additionally or alternatively, if the at least one power contact resistance LR+, LR− determined or the at least one resistance value determined reaches or exceeds the resistance limit value RG, decreasing a maximum released power mfL and/or a maximum released power current mfLI, in particular switching off the battery pack 1, the work apparatus 3 and/or the charging apparatus 4, in particular by means of the battery management system 101.

In the exemplary embodiments shown, the battery management system 101 and the output and/or transmission device 13 are signal-connected.

Figure 5:
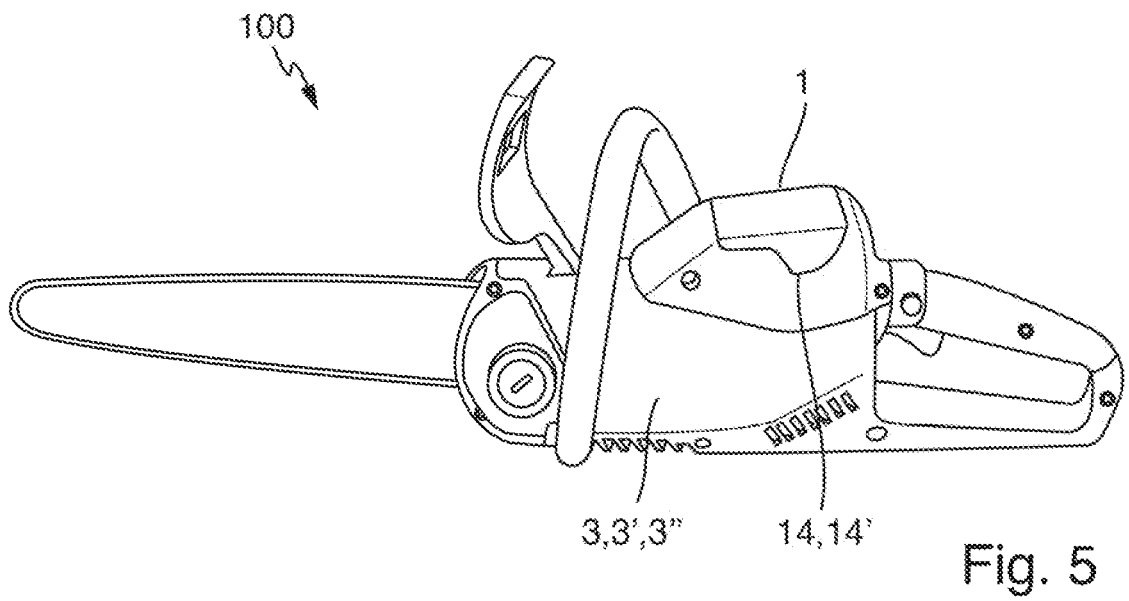
FIG. 5 is a perspective view of the system from FIGS. 1 and 2.

In addition, in FIG. 5 the work apparatus 3 is a saw 3', in particular a chainsaw 3".

In alternative exemplary embodiments, the work apparatus may be a pole-mounted pruner, a bush cutter, a hedge trimmer, a hedge cutter, a blower, a leaf blower, a lopper, an angle grinder, a sweeper, a sweeping roller, a sweeping brush, a lawnmower, a scarifier, a grass trimmer or a high-pressure cleaner.

Moreover, the work apparatus 3 and/or the charging apparatus 4 comprise(s) a battery receptacle 14, in particular a battery slot 14'. The battery receptacle 14 is designed for receiving the battery pack 1; in particular, the battery pack 1 is received.

As made clear by the exemplary embodiments shown and explained above, the invention provides an advantageous method and an advantageous system in each case for determining at least one power contact resistance between at least one pack power contact of a battery pack and at least one apparatus power contact of an electrically driven work apparatus or of a charging apparatus or at least one resistance value corresponding to the at least one power contact resistance, said method and said system having in each case improved properties.

What is claimed is:

1. A method for determining at least one power contact resistance or at least one resistance value corresponding to the at least one power contact resistance, between at least one pack power contact of a battery pack and at least one apparatus power contact of an electrically driven work apparatus or of a charging apparatus, the method comprising:
   loading the at least one pack power contact and the at least one apparatus power contact that touch one another with a power current;
   electrically connecting the battery pack and the work apparatus or the charging apparatus by way of a data communication line for transmitting a data communication signal; and
   determining, with circuitry, the at least one power contact resistance or the at least one resistance value by comparing a signal voltage variable associated with the data communication signal transmitted on the data communication line and a power voltage variable of the at least one pack power contact or of the at least one apparatus power contact with one another,
   wherein the signal voltage variable or the power voltage variable is dependent on at least one voltage drop caused by the power current and the at least one power contact resistance;
   wherein one of:
     the power voltage variable is at least one of a power voltage potential of the pack power contact or a power voltage difference between a positive power voltage potential of a positive pack power contact and a negative power voltage potential of a negative pack power contact, or
     the power voltage variable is at least one of a power voltage potential of the apparatus power contact or a power voltage difference between a positive power voltage potential of a positive apparatus power contact and a negative power voltage potential of a negative apparatus power contact; and
   wherein the signal voltage variable associated with the data communication signal is at least one of a signal voltage level of the data communication line or a signal voltage difference between a high signal voltage level and a low signal voltage level.

2. The method according to claim 1, further comprising:
   determining the at least one power contact resistance or the at least one resistance value by determining the power current.

3. The method according to claim 1,
   wherein the data communication line is different from the at least one pack power contact and the at least one apparatus power contact,
   wherein the battery pack comprises a pack data contact, which is different from the at least one pack power contact,
   wherein the work apparatus or the charging apparatus comprises an apparatus data contact, which is different from the at least one apparatus power contact, wherein the pack data contact and the apparatus data contact touch one another, and wherein the data communication line is at least partly produced by the touching of the pack data contact and the apparatus data contact.

4. The method according to claim 1, wherein:

the comparing comprises ascertaining a difference of the signal voltage variable and the power voltage variable from one another.

5. The method according to claim 1, further comprising:

determining the power contact resistance or the resistance value corresponding to the power contact resistance between the pack power contact of the battery pack and the apparatus power contact of the work apparatus or of the charging apparatus by way of comparing the signal voltage level and the power voltage potential with one another, wherein the signal voltage level or the power voltage potential is dependent on a voltage drop caused by the power current and the power contact resistance, and/or determining the power contact resistance or the resistance value corresponding to the power contact resistance between the pack power contact of the battery pack and the apparatus power contact of the work apparatus or of the charging apparatus by way of comparing the signal voltage difference and the power voltage difference with one another, wherein the signal voltage difference or the power voltage difference is dependent on at least one voltage drop caused by the power current and the at least one power contact resistance.

6. The method according to claim 1, wherein the signal voltage variable is referenced to a power voltage potential of the apparatus power contact and/or is dependent on a power voltage difference between a positive power voltage potential of a positive apparatus power contact and a negative power voltage potential of the negative apparatus power contact, or wherein the signal voltage variable is referenced to a power voltage potential of the pack power contact and/or is dependent on a power voltage difference between a positive power voltage potential of a positive pack power contact and a negative power voltage potential of a negative pack power contact.

7. The method according to claim 1, wherein the data communication line is electrically connected to a signal output of a transmitter of the work apparatus or of the charging apparatus or of the battery pack, wherein at least one supply voltage potential of the transmitter is dependent on at least one voltage drop caused by the power current and the at least one power contact resistance, and wherein the transmitter has a power supply rejection ratio, and/or wherein at least one supply voltage potential of the transmitter is referenced to at least one power voltage potential of the at least one apparatus power contact or at least one power voltage potential of the at least one pack power contact, and/or wherein at least one supply voltage input of the transmitter is electrically connected in parallel with the at least one apparatus power contact or the at least one pack power contact.

8. The method according to claim 1, wherein the data communication signal comprises operating data information, rotational speed information, current information, voltage information, power information, discharge information, charging information, temperature information, state information, fault information and/or identifier information.

9. The method according to claim 1, wherein the at least one pack power contact and/or the at least one apparatus power contact are/is a plug connector.

10. The method according to claim 1, wherein a rated voltage of the battery pack, of the work apparatus, and/or of the charging apparatus is a minimum of 18 V or a minimum of 30 V, and/or a maximum of 72 V or a maximum of 54 V, and/or wherein a maximum power current of the battery pack, of the work apparatus, and/or of the charging apparatus is a minimum of 1 A or a minimum of 1.5 A, and/or a maximum of 1000 A or a maximum of 750 A, and/or wherein a maximum power of the battery pack, of the work apparatus, and/or of the charging apparatus is a minimum of 1 kW or a minimum of 2 kW, and/or a maximum of 10 KW or a maximum of 5 kW, and/or wherein a maximum energy content of the battery pack is a minimum of 100 Wh or a minimum of 200 Wh, and/or a maximum of 4000 Wh or a maximum of 2000 Wh.

11. The method according to claim 1, further comprising:

outputting and/or transmitting information about the at least one power contact resistance determined or the at least one resistance value determined when the at least one power contact resistance determined or the at least one resistance value determined reaches or exceeds a resistance limit value, and/or when the at least one power contact resistance determined or the at least one resistance value determined reaches or exceeds a resistance limit value, decreasing a maximum released power and/or a maximum released power current, by switching off the battery pack, the work apparatus, and/or the charging apparatus.

12. A system comprising circuitry configured to automatically determine at least one power contact resistance or at least one resistance value corresponding to the at least one power contact resistance between at least one pack power contact of a battery pack and at least one apparatus power contact of an electrically driven work apparatus or of a charging apparatus, wherein the at least one pack power contact and the at least one apparatus power contact touch one another and are loaded with a power current, wherein the battery pack and the work apparatus or the charging apparatus are electrically connected by a data communication line for transmitting a data communication signal, wherein the circuitry of the system is configured to automatically determine the at least one power contact resistance or the at least one resistance value by comparing a signal voltage variable associated with the data communication signal transmitted on the data communication line and a power voltage variable of the at least one pack power contact or of the at least one apparatus power contact with one another, and wherein the signal voltage variable or the power voltage variable is dependent on at least one voltage drop caused by the power current and the at least one power contact resistance;

wherein one of:

the power voltage variable is at least one of a power voltage potential of the pack power contact or a power voltage difference between a positive power voltage potential of a positive pack power contact and a negative power voltage potential of a negative pack power contact, or the power voltage variable is at least one of a power voltage potential of the apparatus power contact or a power voltage difference between a positive power voltage potential of a positive apparatus power contact and a negative power voltage potential of a negative apparatus power contact; and wherein the signal voltage variable associated with the data communication signal is at least one of a signal voltage level of the data communication line or a signal voltage difference between a high signal voltage level and a low signal voltage level.

13. The system according to claim 12, wherein the system comprises the battery pack, the work apparatus, and/or the charging apparatus.

14. The system according to claim 12, wherein the circuitry is further configured to:
at least one of output or transmit information about the at least one power contact resistance determined or the at least one resistance value determined when the at least one power contact resistance determined or the at least one resistance value determined reaches or exceeds a resistance limit value.

15. The system according to claim 12, wherein the circuitry is further configured to:
when the at least one power contact resistance determined or the at least one resistance value determined reaches or exceeds a resistance limit value, at least one of decreasing a maximum released power or a maximum released power current, by at least one of switching off the battery pack, the work apparatus, or the charging apparatus.

* * * * *